US006856535B2

(12) United States Patent
Madan (10) Patent No.: US 6,856,535 B2
(45) Date of Patent: Feb. 15, 2005

(54) REFERENCE VOLTAGE GENERATOR FOR FERROELECTRIC MEMORY

(75) Inventor: Sudhir K. Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 95 days.

(21) Appl. No.: 10/347,768

(22) Filed: Jan. 21, 2003

(65) Prior Publication Data

US 2004/0141353 A1 Jul. 22, 2004

(51) Int. Cl.$^7$ .................. G11C 11/22; G11C 11/12; G11C 7/00; G11C 7/02; G11C 8/00
(52) U.S. Cl. .................. 365/145; 365/65; 365/136; 365/189.09; 365/203; 365/210; 365/214; 365/230.03
(58) Field of Search .................. 365/154, 65, 136, 365/189.09, 203, 210

(56) References Cited

U.S. PATENT DOCUMENTS

| | | | |
|---|---|---|---|
| 4,081,701 A | 3/1978 | White, Jr. et al. | |
| 4,716,320 A | 12/1987 | McAdams | |
| 5,029,136 A | 7/1991 | Tran et al. | |
| 5,424,975 A | 6/1995 | Lowrey et al. | |
| 5,541,872 A | * 7/1996 | Lowrey et al. | 365/145 |
| 5,682,343 A | * 10/1997 | Tomishima et al. | 365/63 |
| 5,737,260 A | * 4/1998 | Takata et al. | 365/145 |
| 5,790,467 A | 8/1998 | Haukness et al. | |
| 5,831,919 A | 11/1998 | Haukness et al. | |
| 5,847,989 A | 12/1998 | Seyyedy | |
| 5,959,922 A | 9/1999 | Jung | |
| 6,002,634 A | * 12/1999 | Wilson | 365/230.06 |
| 6,236,588 B1 | * 5/2001 | Koo | 365/145 |
| 6,285,576 B1 | * 9/2001 | Kang | 365/145 |
| 6,307,797 B1 | * 10/2001 | Fournel et al. | 365/203 |
| 6,347,059 B2 | 2/2002 | Böhm et al. | |
| 6,594,174 B2 | * 7/2003 | Choi et al. | 365/145 |
| 6,600,689 B2 | * 7/2003 | Hibino | 365/210 |
| 2001/0024396 A1 | 9/2001 | Bohm et al. | |
| 2001/0033510 A1 | * 10/2001 | Allen et al. | 365/145 |
| 2001/0038557 A1 | 11/2001 | Braun et al. | |
| 2003/0099125 A1 | * 5/2003 | Kang | 365/145 |
| 2003/0210584 A1 | * 11/2003 | Allen et al. | 365/200 |
| 2004/0047172 A1 | * 3/2004 | Komatsuzaki | 365/145 |
| 2004/0114416 A1 | * 6/2004 | Noh | 365/145 |
| 2004/0125653 A1 | * 7/2004 | Tran et al. | 365/185.22 |

FOREIGN PATENT DOCUMENTS

JP   2001307478 A  * 11/2001   ........... G11C/11/22

* cited by examiner

Primary Examiner—David Nelms
Assistant Examiner—Ly Duy Pham
(74) Attorney, Agent, or Firm—Jacqueline J. Garner; W. James Brady, III; Frederick J. Telecky, Jr.

(57) ABSTRACT

Apparatus and methods are provided for providing reference voltages during read operations in ferroelectric memories, in which a bitline of a reference array substantially similar or identical to a portion of a ferroelectric data array is precharged and then coupled with a bitline in the data array to provide a reference voltage according to a ratio of a number of reference memory cells along the coupled reference bitline to the number of reference memory cells along the coupled reference bitline plus a number of data memory cells along the coupled data bitline.

4 Claims, 7 Drawing Sheets

REFERENCE VOLTAGE GENERATOR FOR FERROELECTRIC MEMORY

FIELD OF INVENTION

The present invention relates generally to semiconductor devices and more particularly to improved apparatus and methods for reference voltage generation in ferroelectric memory devices.

BACKGROUND OF THE INVENTION

In semiconductor memory devices, data is read from or written to memory cells in the device according to decoded address information and various other control signals. Such memory devices are used for storage of data and/or program code in personal computer systems, embedded processor-based systems, video image processing circuits, and the like. Ferroelectric memories are commonly organized in single-transistor, single-capacitor (1T1C) or two-transistor, two-capacitor (2T2C) configurations, in which each memory cell includes one or more access transistors, as is generally known. In a folded bitline architecture, the individual ferroelectric memory cells typically include a ferroelectric (FE) capacitor adapted to store a binary data bit, together with a MOS access transistor, which operates to selectively connect the FE capacitor to one of a pair of complementary bitlines, with the other bitline being connected to a reference voltage for read operations. The individual cells are commonly organized as individual bits of a corresponding data word, where the cells of a given word are accessed concurrently by activation of platelines and wordlines by address decoding control circuitry.

Such ferroelectric memory devices provide non-volatile data storage where the data cell capacitors are constructed using ferroelectric dielectric material which may be polarized in one direction or another in order to store a binary value. The ferroelectric effect allows for the retention of a stable polarization in the absence of an applied electric field due to the alignment of internal dipoles within Perovskite crystals in the dielectric material. This alignment may be selectively achieved by application of an electric field which exceeds the coercive field of the material. Conversely, reversal of the applied field reverses the internal dipoles. The response of the polarization of a ferroelectric capacitor to the applied voltage may be plotted as a hysteresis curve.

Data in a ferroelectric data cell is read by connecting a reference voltage to a first bitline and connecting the cell capacitor between a complementary bitline and a plateline signal. This provides a differential voltage on the bitline pair, which is connected to a differential sense amp circuit. The reference voltage is typically supplied at an intermediate voltage between the voltage associated with a capacitor charged to a binary "0" and that of the capacitor charged to a binary "1". The polarity of the sensed differential voltage thus represents the data stored in the cell, which is buffered by the sense amp and provided to a pair of local IO lines. The transfer of data between the ferroelectric memory cell, the sense amp circuit, and the local data bitlines is controlled by various access transistors, typically MOS devices, with switching signals being provided by control circuitry including address decoders and timing circuits in the device.

Connection of the ferroelectric cell capacitor between the plateline pulse and the bitline during a read operation causes an electric field to be applied to the cell capacitor. If the field is applied in a direction to switch or reverse the internal dipoles, more charge will be moved than if the dipoles are not reversed. As a result, the sense amplifier can measure the charge applied to the cell bit lines and produce either a logic "1" or "0" differential voltage at the sense amp terminals. Since reading the cell data is a destructive operation, the sensed data is then restored to the cell following each read operation. To write data to the cell, an electric field is applied to the cell capacitor by a sense amp or write buffer to polarize it to the desired state. Ferroelectric memories provide certain performance advantages over other forms of non-volatile data storage devices, such as flash and EEPROM type memories. For example, ferroelectric memories offer short programming (e.g., write access) times and low power consumption.

Ferroelectric memory devices typically include a number of individually addressable memory cells arranged in an array configuration, wherein the array is typically organized as a matrix of rows and columns. Conventionally, data is stored into a memory array as a row, and read out from the memory array as a row, where the row typically consists of 8, 16, 32, or 64 bits of binary data. During a write operation, row decoder control circuitry provides a plateline pulse signal to the first sides of the ferroelectric cells in a data row, the other sides of which are connected to the write data. In a read operation, the decoder provides plate line pulses to the first side of each ferroelectric memory cell in a data row, and sense amplifiers are connected to the other side of the cells to sense a row of stored data bits in parallel fashion. Thus, in a single read operation, an entire row of data bits (e.g., 8, 16, 32, or 64 bits) are obtained from the memory cells in the selected row.

Figure 1:
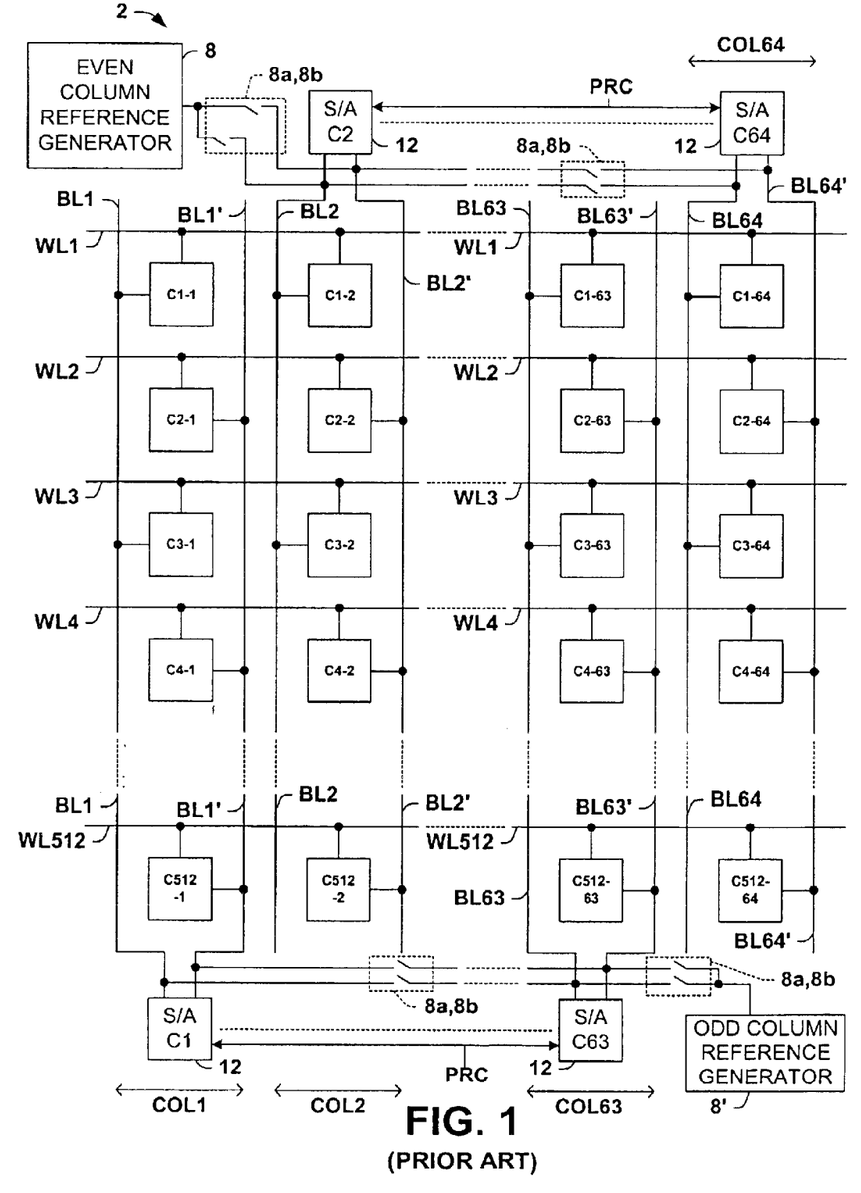
FIG. 1 is a schematic diagram illustrating a portion of a folded bitline ferroelectric memory device having a conventional shared reference generator configuration.

FIG. 1 illustrates a portion of a ferroelectric memory device 2 organized in a folded bitline architecture, having 512 rows (words) and 64 columns (bits) of data storage cells $C_{ROW-COLUMN}$, where each column of cells is accessed via a pair of complementary bitlines $BL_{COLUMN}$ and $BL_{COLUMN}'$. In the first row of the device 2, for example, the cells C1-1 through C1-64 form a 64 bit data word accessible via a wordline WL1 and complementary bitline pairs BL1/BL1' through BL64/BL64'. The cell data is sensed during data read operations using sense amp circuits 12 (S/A C1 through S/A C64) associated with columns 1 through 64, respectively. In the illustrated configuration, the 1T1C cells $C_{ROW-COLUMN}$ individually include a single ferroelectric cell capacitor and an access transistor to connect the cell capacitor between one of the complementary bitlines associated with the cell column and a plateline, where the other bitline is selectively connected to a reference voltage for read operations.

In the device 2, the sense amps 12 associated with even numbered columns are located at the top of the segment, and the sense amps 12 associated with odd numbered columns are located at the bottom of the segment. Shared reference generators 8 and 8' are provided at the top and bottom of the segment columns, respectively. The even column reference generator 8 provides a reference voltage for even numbered columns and the odd column reference generator 8' is provided for the odd numbered columns. The reference voltages from the generators 8, 8' are coupled to one of the bitlines in the columns by one of a pair of switches 8a, 8b, depending upon whether an even or odd numbered wordline is selected. In reading the first data word along the wordline WL1, the cells C1-1 through C1-64 are connected to the sense amps via the bitlines BL1, BL2 . . . , BL63, and BL64 while the complementary reference bitlines BL1', BL2' . . . , BL63', and BL64' are connected to the reference voltage generators 8, 8'.

During a read operation in a conventional folded bitline ferroelectric memory, a signal level $V_1$ or $V_0$ is thus obtained on the data bitline (e.g., the bitline coupled with the accessed cell), depending upon the state of the data being read (e.g., binary "1" or "0", respectively). The reference voltage from the shared reference generators 8, 8' is thus ideally a voltage $V_{REF}$ in between $V_1$ and $V_0$, which is then applied to the complementary bitline before the sense amps 12 are enabled. Thusfar, two types of reference generation schemes have been employed in ferroelectric memory devices. In the first type (e.g., FIG. 1), a single reference generator is common to (e.g., shared by) several columns. In a second approach, a separate (e.g., dedicated) reference generator is provided for each column. A problem with the first approach is that several reference bitlines are sorted together through the common reference generator during read operations. In this situation, a bad column cannot be distinguished or isolated from other (e.g., presumably good) columns, thus making replacement or substitution impossible for a single bad column, where column redundancy is employed.

However, several challenges are presented in implementing the second approach, including reliability, area utilization, and power consumption. In the past, the generated reference voltage in such dedicated reference generator architectures is often a function of bitline capacitance, leading to variation in $V_{REF}$ for different array columns. Accordingly, there remains a need for improved apparatus and methods for providing reference voltages for ferroelectric memory devices, by which the above and other shortcomings of the prior art may be mitigated or overcome.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to methods and apparatus for generating a reference voltage for use in read operations in a ferroelectric memory, which involve the addition of several rows of ferroelectric reference memory cells in a reference array substantially similar to the data array or arrays to be read. The ferroelectric reference array comprises ferroelectric reference memory cells coupled with reference bitlines, where the reference bitlines are precharged and selectively coupled with data array bitlines to provide ratiometric reference voltages during read operations. Once coupled, the bitline voltage, which will serve as a reference voltage, equalizes to a value between a precharge voltage of the data bitline and a precharge voltage of the reference bitline.

Since the reference array is constructed of ferroelectric cells substantially similar to those of the data array, the reference and data bitline coupling operates as a capacitive divider, wherein the resulting reference voltage is related to the ratio of the number of reference cells along the reference bitline and the number of data cells along the data bitline. In this manner, the number of rows in the reference array, and/or the precharge voltages, may be selected to provide any desired reference voltage level, which is substantially insensitive to bitline capacitance variations. The invention may by implemented as a low power reference generation scheme to provide reference voltages individually to data array columns, by which the above mentioned shortcomings of shared reference generator techniques may be overcome.

One aspect of the invention is directed to a reference generator for providing a reference voltage to a data bitline precharged to a first voltage in a folded bitline ferroelectric memory device. The reference generator comprises a ferroelectric reference memory array substantially similar to a data memory array in the memory device, as well as a reference charging circuit adapted to selectively charge a reference bitline in the reference memory array to a second voltage in a read operation. The reference generator further comprises a switching circuit adapted to selectively couple the precharged data bitline with the precharged reference bitline, in order to provide a reference voltage on the coupled data and reference bitlines between the first and second voltages. In one example illustrated and described below, the data bitlines are precharged to ground and the reference bitlines are precharged to a supply voltage such as VDD.

In another aspect of the invention, a semiconductor device is provided, comprising a data memory array and a reference memory array. The data memory array comprises a first set of ferroelectric data memory cells coupled with a first data bitline and a second set of ferroelectric data memory cells coupled with a second data bitline in a folded bitline configuration, as well as a data charging circuit. The data charging circuit selectively charges the second data bitline to a first voltage in a read operation targeting one of the first set of data memory cells and charges the first data bitline to the first voltage in a read operation targeting one of the second set of data memory cells.

The reference memory array comprises a first set of ferroelectric reference memory cells coupled with a first reference bitline, and a second set of ferroelectric reference memory cells coupled with a second reference bitline, wherein the reference memory cells are substantially similar to data memory cells. A reference charging circuit charges the second reference bitline to a second voltage in a read operation targeting one of the first set of data cells and charges the first reference bitline to the second voltage in a read operation targeting one of the second set of data memory cells. A switching circuit is provided to selectively couple the second data bitline with the second reference bitline or the first data bitline with the first reference bitline depending upon which data memory cell row is being read.

According to yet another aspect of the invention, a method of generating a reference voltage in a semiconductor device is provided. The method comprises charging a first data bitline in a ferroelectric data array to a first voltage in a read operation in which a ferroelectric data cell coupled with a second complementary data bitline is to be read. A first reference bitline in a ferroelectric reference array is precharged to a second voltage in the read operation, wherein the reference array is substantially similar to the data array. The method further comprises coupling the first data bitline with the first reference bitline after charging the first reference bitline and the first data bitline. This provides a ratiometric reference voltage during the read operation according to the number of data memory cells along the coupled data bitline and a number of reference memory cells along the coupled reference bitline.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. The invention relates to semiconductor devices and reference generator apparatus therefor, as well as methods for providing reference voltages in ferroelectric memory read operations. One or more exemplary implementations are hereinafter illustrated and described in the context of folded bitline type ferroelectric memory architectures. However, it will be appreciated that other implementations are possible within the scope of the present invention and appended claims, and that the invention is not limited to the illustrated examples.

Figure 2:
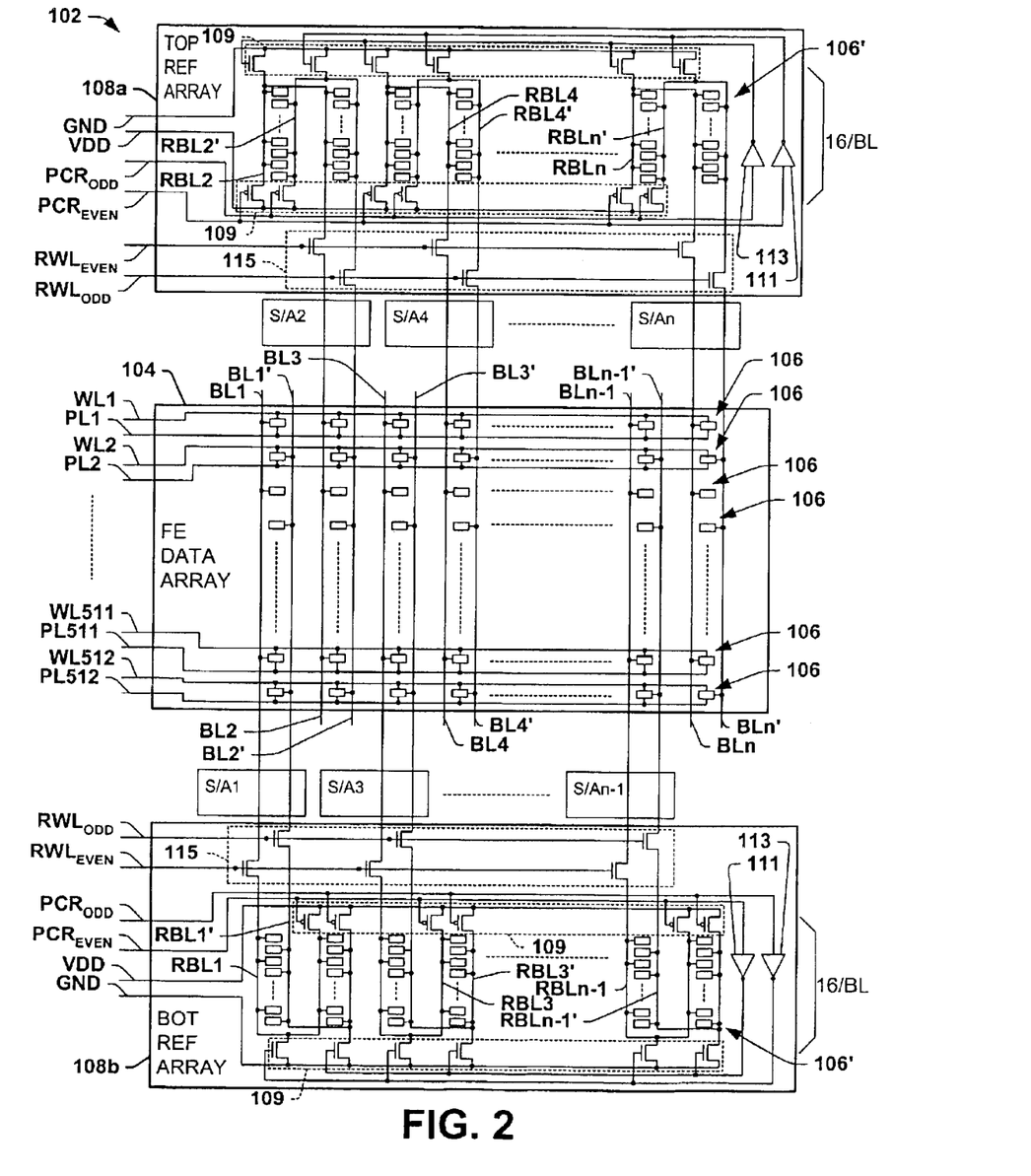
FIG. 2 is a schematic diagram illustrating a portion of an exemplary ferroelectric memory device comprising reference generator apparatus in accordance with one or more aspects of the present invention.
Figure 3A:
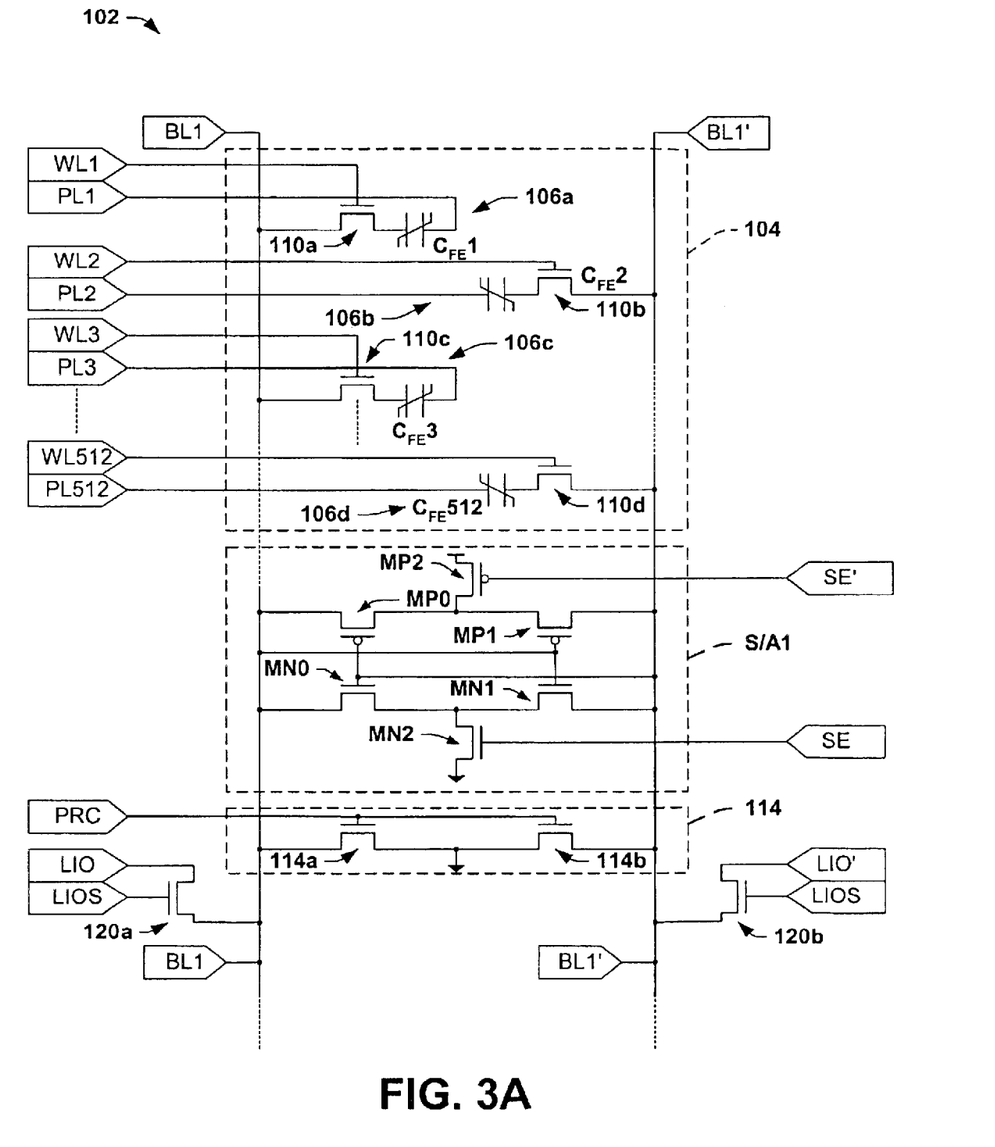
FIGS. 3A and 3B are schematic diagrams illustrating further details of an exemplary column in the memory device of FIG. 2.
Figure 3B:
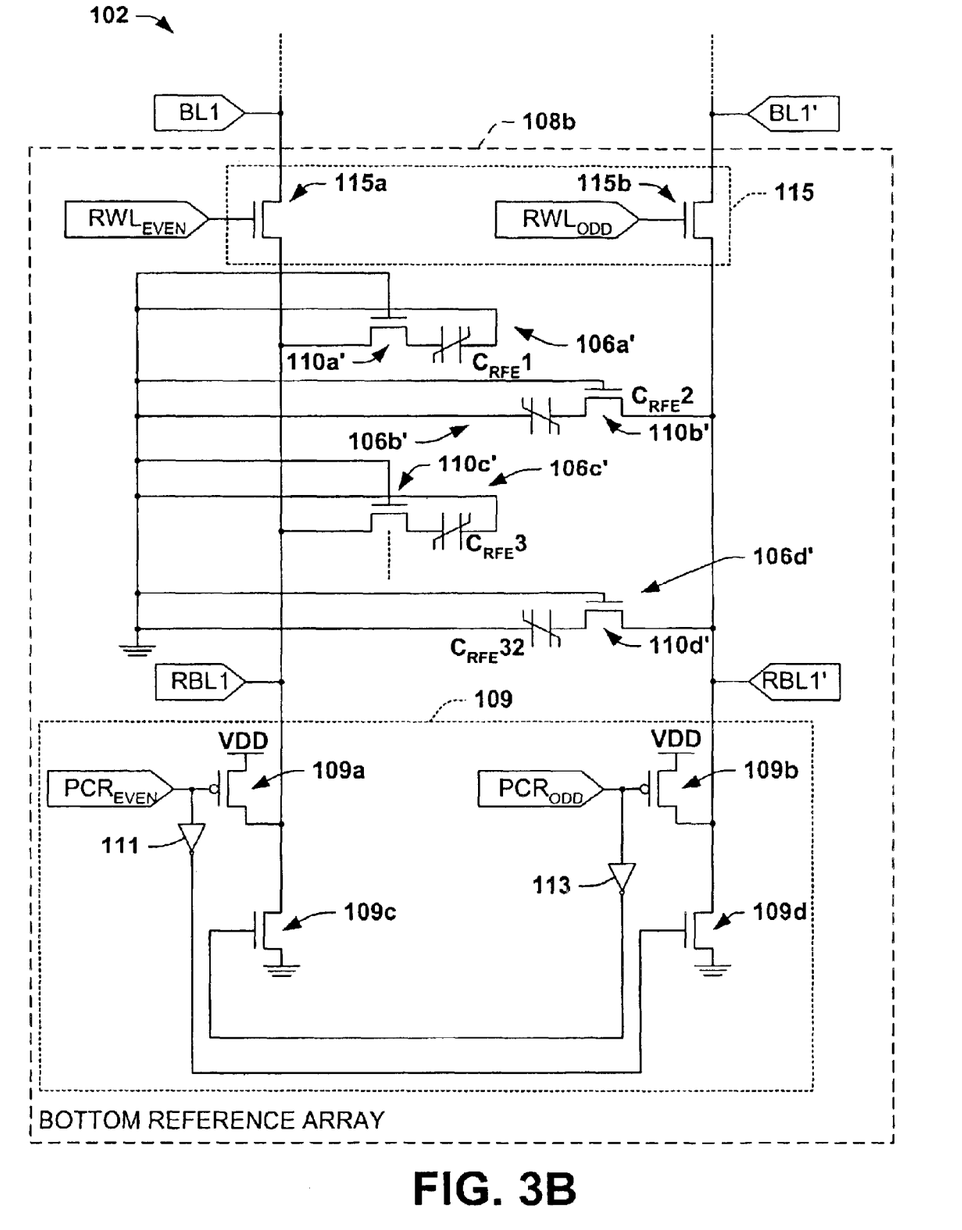
Figure 4:
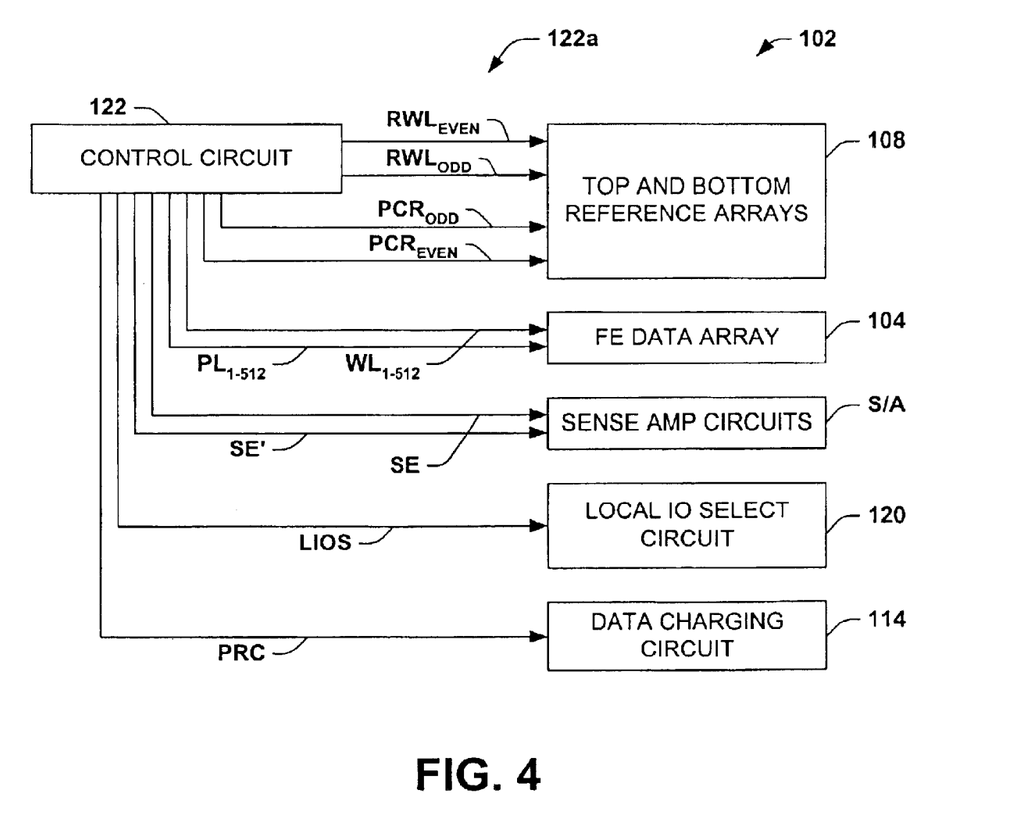
FIG. 4 is a schematic diagram illustrating an exemplary control circuit providing timing and control signals in the memory device of FIGS. 2, 3A, and 3B.

Referring initially to FIGS. 2–4, an exemplary semiconductor device 102 is illustrated comprising a folded bitline ferroelectric data memory array 104, top and bottom ferroelectric reference memory arrays 108a and 108b (hereinafter collectively designated as 108), and sense amps S/A1-S/An. The data memory array 104 comprises first and second sets of 1T1C ferroelectric data memory cells 106 organized in rows along odd and even numbered wordlines WL512, respectively, and columns along complementary data bitline pairs BL/BL' in a folded bitline configuration, wherein the wordlines WL1–WL512 and other control and timing signals 122a in the device 102, are provided by a control circuit 122 (FIG. 4). The first set of data cells 106 along the odd numbered wordlines WL1, WL3, . . . , WL511 are coupled with first data bitlines BL1, BL2, . . . , BLn, and the second set of data cells 106 along even numbered wordlines WL2, WL4, . . . , WL512 are coupled with second complementary data bitlines BL1', BL2', . . . , BLn', respectively. The word line numbering illustrated in FIGS. 2–4 is exemplary only. Other implementations are possible within the scope of the invention, in which cells along consecutive word line pairs for example WL1/WL2, WL5/WL6, . . . , WL509/WL510 may be coupled to the first set of data bitlines BL1, BL2, . . . , BLn, respectively, and the cells along the other pairs WL3NWL4, WL7/WL8, . . . , WL511/WL512 may be coupled to the second complimentary data bitlines BL1', BL2', .BLn'.

FIGS. 3A and 3B illustrate further details of the first column along the data bitline pair BL1/BL1', as well as a portion of the bottom reference array 108b and the sense amp S/A1, wherein several exemplary ferroelectric memory data cells 106a–106d are illustrated comprising FE capacitors $C_{FE}1$–$C_{FE}512$ and MOS access transistors 110a–110d configured in a column along the pair of complementary bitlines BL1 and BL1'. The exemplary ferroelectric data memory array 104 in the device 102 comprises an integer number "n" of such columns, for example, 64 columns in the illustrated device 102. The ferroelectric cell capacitors $C_{FE}$ of the data array 104, as well as the ferroelectric capacitors $C_{RFE}$ of the reference array 108 may be fabricated from any appropriate ferroelectric material in a wafer, such as Pb(Zr,Ti)O3 (PZT), (Ba,Sr)TiO3 (BST), SrTiO3 (STO), SrBi2Ta2O9 (SBT), BaTiO3 (BTO), (Bil-xLax) 4Ti3O12 (BLT), or other ferroelectric material fabricated between two conductive electrodes to form a ferroelectric capacitor.

The data memory cells 106a–106d of FIG. 3A and the contents thereof are accessed during read, restore, and write operations via the data array bitlines BL1 and BL1' using the wordline and plateline signals WL1–WL512 and PL1–PL512, respectively. The FE capacitors of odd numbered data words, such as $C_{FE}1$, may be connected to the data bitline BL1 via WL1 and activated via a plateline signal (e.g., pulse) on the plateline PL1, and the FE capacitors in even numbered data words, such as $C_{FE}2$, may be connected to the complementary data bitline BL1' via WL2 and activated via PL2. In the first column, a reference voltage $V_{REF}$ is applied to the other (e.g., complementary) data bitline (e.g., to BL1' for a read along an odd numbered row, or to BL1 for a read along an even numbered row) via the bottom ferroelectric reference array 108b in accordance with the invention.

In the exemplary semiconductor device in FIGS. 2, 3A and 3B, the plate lines PL1, PL2, . . . PL512 are shown separately. However, in order to reduce number of plateline drivers and reduce chip area, it may be advantages to short several of them together and reduce the number of drivers. As an example we could short 64 of them together. In that case, only 8 plate line drivers instead of 512 drivers would be needed. To activate a cell, both the word line and the plate line associated with it would be activated. Since only one wordline is activated at a given time, activating plate lines of unselected wordlines does not impact the array operation.

The data memory bitlines BL1 and BL1', as with the complementary bitline pairs of the other columns in the data array 104 are precharged or equalized during read and other data memory access operations to a predetermined first voltage (e.g., ground) via a data charging circuit 114 comprising transistors 114a and 114b according to a data charging signal PRC from the control circuit 122. The exemplary data charging circuit 114 charges both the data bitlines BL1 and BL1' to ground in read operations. However, any data charging circuit may be employed in accordance with the invention, which selectively charges BL1' to a first voltage in a read operation targeting a cell coupled with BL1 (odd word read) and which charges BL1 to the first voltage in a read operation targeting a cell coupled with BL1' (even word read).

A cross-coupled latch sense amp circuit S/A1 is provided in the present example for reading, writing, and restoring cell data along the first column data bitline pair BL1/BL1', which comprises NMOS transistors MN0, MN1, and MN2 as well as PMOS transistors MP0, MP1, and MP2. The sense amp S/A1 is enabled using sense amp enable signals SE and SE' provided by the control circuit 122 to sense amp transistors MN2 and MP2, respectively. Although illustrated and described herein in the context of the exemplary cross-coupled sense amp S/A1 of FIGS. 2 and 3A, the invention finds utility in association with any type of sense amp. An IO select circuit 120 is provided comprising transistors 120a and 120b for selectively coupling the data bitlines BL1/BL1' with local IO lines LIO and LIO', respectively, according to a local IO select control signal LIOS from the control circuit 122.

Referring to FIGS. 2, 3B, and 4, the top and bottom reference memory arrays 108a and 108b comprise first and second sets of 1T1C ferroelectric reference memory cells 106' substantially similar or identical to the data memory cells 106 in the data array 104, where the first set of reference cells 106' are organized along first reference bitlines RBL1, RBL2, . . . , RBLn and a second set of reference cells 106' are organized along complementary second reference bitlines RBL1', RBL2', . . . , RBLn'. FIG. 3B illustrates further details of the first column along the reference bitline pair RBL1/RBL1' in the bottom reference array 108b. Several exemplary ferroelectric memory reference cells 106a'–106d' are illustrated in FIG. 3B, comprising FE capacitors $C_{RFE}1$–$C_{RFE}32$ and MOS access transistors 110a'–110d' configured in a column along the pair of complementary reference bitlines RBL1 and RBL1'. It is noted in FIG. 2 that the reference array size may be reduced by coupling cells from a reference bitline over the width of two data array columns. In the illustrated example, this is possible since the sense-amp pitch is twice that of data array columns, wherein only half of the sense-amps are at the array top and other half are at the array bottom.

The exemplary bottom reference array 108b comprises sixteen reference cells (e.g., odd numbered cells 106a', 106c', etc.) along the first reference bitline RBL1 and sixteen reference cells (e.g., even numbered cells 106b', 106d', etc.) along the second reference bitline RBL1'. However, any number of rows of ferroelectric reference cells may be provided, wherein the exemplary reference array 108 in this example comprises an integer number "n" columns corresponding to the number of columns "n" in the data array 104 (e.g., 64 in one example). The gate terminals of the NMOS type access transistors 110a'–110d' in the bottom reference array (e.g., as well as those of the top reference array 108a) are grounded.

In operation, individual reference bitlines RBL of the reference arrays 108 are charged to a second voltage, such as a supply voltage VDD during read operations, and are then coupled with data bitlines in the data array 104 to provide reference voltages in a ratiometric manner during read operations. Because the reference array 108 is constructed of ferroelectric cells 106' substantially similar to the cells 106 of the data array 104, the coupling of the data bitlines BL or BL' (e.g., precharged to the first voltage GND) and the reference bitlines RBL or RBL' (e.g., precharged to the second voltage VDD) provides a capacitive divider. In this regard, the cells and structure of the reference array 108 and the data array 104 need not be identical. However, it is noted that the invention advantageously allows the same or similar memory array layout, including device sizing, spacing, interconnection, etc. to be employed in fabricating the reference array 108 and the data array 104.

The resulting reference voltage on the coupled data and reference bitlines is thus to a large extent related to the first precharged voltage plus the difference between the second and first precharge voltages times the ratio of the number of reference cells 106' along the reference bitline RBL or RBL' (e.g., 16 in the illustrated example) and the number of data cells 106 along the data bitline BL or BL' (e.g., 256 in the exemplary device 102) plus the number of reference cells 106' along the reference bitline RBL or RBL' (e.g., 16 in the illustrated example), assuming that the parasitic capacitance on the data bitlines from other circuits coupled to it, such as, sense-amp etc. is small compared to data bitline capacitance. In this manner, the number of reference rows (e.g., the number of cells along the reference bitlines RBL or RBL') in the reference array 108, and/or the first and second precharge voltages (e.g., ground and VDD in this example), may be selected to provide any desired reference voltage level, which is substantially insensitive to bitline capacitance variations.

As illustrated in FIGS. 2 and 3B, the reference array 108 comprises a reference charging circuit 109 comprising PMOS transistors (e.g., such as transistor 109a in FIG. 3B) adapted to selectively charge the first reference bitlines RBL1, RBL2, . . . , RBLn to the second voltage (e.g., VDD in this example) in read operations in which data memory cells 106 along the second data bitlines BL1', BL2', . . . , BLn' are being read (e.g., during an even numbered word read operation along an even numbered wordline WL2, WL4, . . . , WLn) according to a reference precharge signal $PCR_{EVEN}$ from the control circuit 122. The reference charging circuit 109 is further adapted to selectively charge the second reference bitlines RBL1', RBL2', . . . , RBLn' (e.g., via transistor 109b in FIG. 3B) to the second voltage VDD during an odd numbered word read operation along an odd numbered wordline WL1, WL3, . . . , WLn-1 in which data memory cells 106 along the first data bitlines BL1, BL2, . . . , BLn are being read according to a reference precharge signal $PCR_{ODD}$ from the control circuit 122.

As illustrated in FIG. 3B, the exemplary reference charging circuit 109 comprises PMOS transistors 109a and 109b gated by the control signals $PCR_{EVEN}$ and $PCR_{ODD}$, respectively, to selectively charge BL1 or BL1' to VDD, respectively. The control circuit 122 asserts one of the signals $PCR_{EVEN}$ or $PCR_{ODD}$ according to whether an even or odd numbered data word is being read. Other implementations are also possible within the scope of the invention, for example, wherein both signals $PCR_{EVEN}$ and $PCR_{ODD}$ are asserted in each read operation, by which all the reference bitlines are effectively precharged to VDD. In the illustrated implementation, however, the reference charging circuit 109 further comprises NMOS transistors 109c and 109d and inverters 111 and 113 inverting the control signals $PCR_{EVEN}$ and $PCR_{ODD}$, respectively, for gating NMOS transistors 109d and 109c. Thus, in the illustrated implementation, one reference bitline is charged to VDD and the complimentary reference bitline is charged to 0V (ground).

The reference arrays 108 further comprise a coupling or switching circuit 115 for coupling the precharged reference bitlines and the precharged data bitlines to establish a reference voltage during read operations. The exemplary switching circuit 115 comprises NMOS transistors (e.g., such as a transistor 115a in FIG. 3B), which are adapted to selectively couple the first reference bitlines RBL1, RBL2, . . . , RBLn (e.g., precharged to VDD via the reference charging circuit 109) with the first data bitlines BL1, BL2, . . . , BLn (e.g., precharged to ground via the data charging circuit 114) in read operations in which data memory cells 106 along the second data bitlines BL1', BL2', . . . , BLn' are being read (e.g., during an even numbered word read operation along an even numbered wordline WL2, WL4, . . . , WLn) according to a switching control signal $RWL_{EVEN}$ from the control circuit 122. The switching circuit 115 is further adapted to couple the second reference bitlines RBL1', RBL2, . . . , RBLn' to the second data bitlines BL1', BL2', . . . , BLn' (e.g., such as via a transistor 115b in FIG. 3B) in an odd numbered word read operation along an odd numbered wordline WL1, WL3, ..., WLn-1 in which data memory cells 106 along the first data bitlines BL1, BL2, ..., BLn are being read according to a switching control signal $RWL_{ODD}$ from the control-circuit 122.

Although not required, the exemplary control circuit 122 provides the data charging control signal PRC and one or both of the reference charging control signals $PCR_{ODD}$/$PCR_{EVEN}$ prior to the switching control signals $RWL_{ODD}$ or $RWL_{EVEN}$. Accordingly, the data bitlines BL/BL' and the reference bitlines RBL/RBL' of interest are precharged to the respective first and second voltages (e.g., ground and VDD), respectively prior to being coupled via the switching circuit 115 in a read operation. Once the precharged reference and data bitlines are coupled, the voltage thereon equalizes to a reference voltage $V_{REF}$ between the first and second voltages according to a ratio of a number of reference memory cells along the coupled reference bitline to the number of reference memory cells along the coupled reference bitline plus a number of data memory cells along the coupled data bitline. In the illustrated implementation, for example, the resulting reference voltage will be about $(VDD-0)*(i_{REF}/(i_{DATA}+i_{REF}))$, wherein $i_{REF}$ is the number of reference memory cells along the coupled reference bitline and $i_{DATA}$ is the number of data memory cells along the coupled data bitline, or $VDD*(16/(256+16))$ in this example.

The other (e.g., complementary) data bitline is then coupled with the data cell of interest according to the asserted wordline WL from the control circuit 122, by which a differential voltage is provided to the terminals of the sense amp S/A to indicate the data stored in the target data cell. In this regard, it is noted that none of the access transistors of the cells along the coupled data bitline, nor those along the coupled reference bitline are on, whereby the line-to-line and line to substrate capacitance (including the capacitance associated with the diffusion region of the access transistor connected to the bitline) of the coupled data and reference bitlines establishes the capacitive divider ratio.

Figure 5:
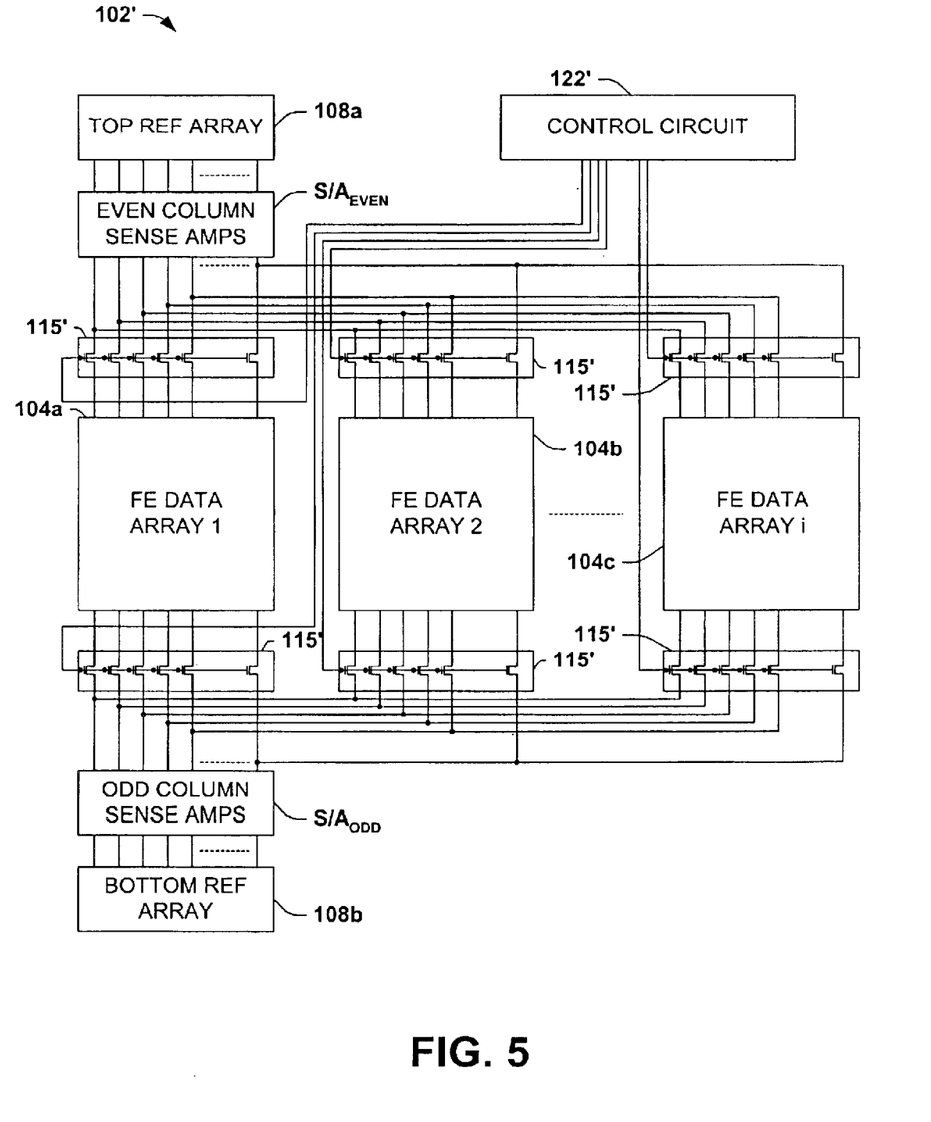
FIG. 5 is a schematic diagram illustrating an alternative implementation in which an exemplary reference array and sense amps are shared between a plurality of data memory arrays.

Referring also to FIG. 5, the exemplary reference array reference generation aspects of the invention may be used to provide reference voltages for a plurality of ferroelectric data memory arrays. Another exemplary device 102' is illustrated, which comprises a plurality of ferroelectric data memory arrays 104a–104c, for example, organized in rows and columns of 1T1C ferroelectric memory cells of the type illustrated and described above. Switching circuits 115' are situated at the top and bottom of each data array 104 providing selective coupling of vertical complementary bitline pairs thereof with even and odd column sense amps $S/A_{EVEN}$ and $S/A_{ODD}$, as well as with top and bottom ferroelectric reference memory arrays 108a and 108b as illustrated and described above. As with the above device 102, the reference array 108 is substantially similar to the data arrays 104.

This aspect of the invention allows sharing of the exemplary reference arrays and associated charging circuitry between any number of such data arrays, wherein the switching circuitry 115' is adapted to selectively couple the reference memory arrays 108 with one of the data memory arrays 104 to provide a reference voltage thereto during a read operation. In this manner the reference generation die area may be reduced for a given device 102'.

Figure 6:
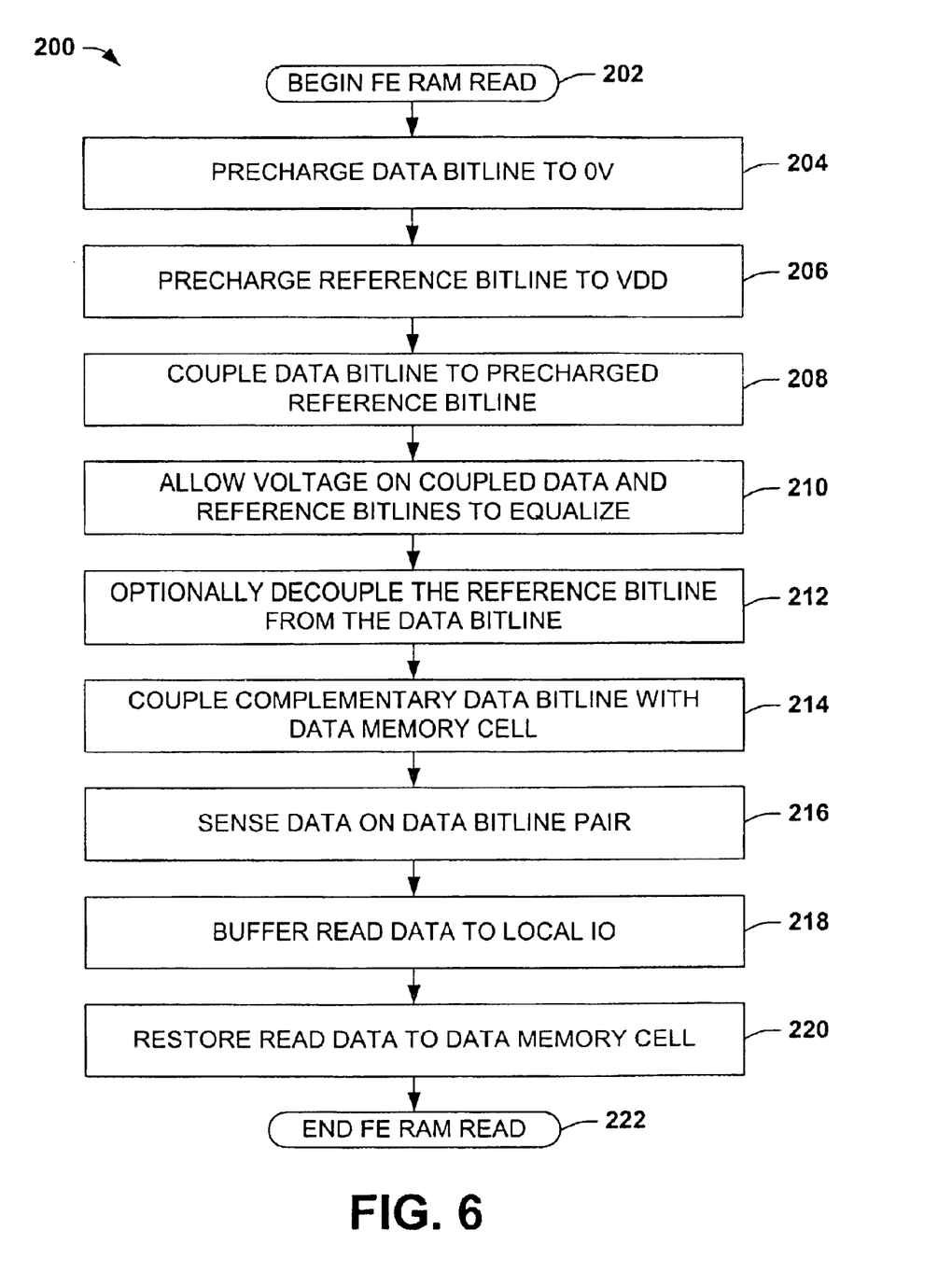
FIG. 6 is a flow diagram illustrating an exemplary method in accordance with another aspect of the invention.

Referring now to FIG. 6, another aspect of the invention provides methods for generating a reference voltage in a semiconductor device for reading one or more ferroelectric data cells. One such exemplary method 200 is illustrated in FIG. 6 and described hereinafter. Although the method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and structures illustrated and described herein as well as in association with other structures not illustrated.

Beginning at 202, the method 200 comprises charging a first data bitline in a ferroelectric data array to a first voltage at 204. For example, in the illustrated device 102 above, the data bitline BL1 may be precharged to ground (e.g., 0V) in a read operation in which a ferroelectric data cell coupled with the second or complementary data bitline BL1' is to be read (e.g., in a read operation along an even numbered wordline). At 206, a reference bitline is charged to a second voltage (e.g., VDD in the example above) in a ferroelectric reference array substantially similar to the data array. The precharged reference and data bitlines are then coupled at 208, and the voltage thereon is allowed to equalize at 210. At 210, for example, the equalized reference voltage $V_{REF}$ will be about $(VDD-0)*(i_{REF}/(i_{DATA}+i_{REF}))$, where $i_{REF}$ is the number of reference memory cells along the coupled reference bitline and $i_{DATA}$ is the number of data memory cells along the coupled data bitline, or $VDD*(16/(256+16))$ in the exemplary device 102 above.

At 212, the reference bitline may optionally be decoupled from the data bitline, and a complementary data memory bitline is coupled with the data memory cell of interest at 214. At 216, the data on the complementary bitline pair is then sensed, for example, using a sense amp S/A as illustrated and described above. The read data is thereafter buffered to local IO circuitry at 218, such as using the exemplary local IO selection circuitry 120 of FIG. 3A above, after which the data is restored to the target data array cell at 220, before the method 200 ends at 222.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A reference generator for providing a reference voltage to a data bitline precharged to a first voltage in a folded bitline ferroelectric memory device, comprising:
- a ferroelectric reference memory array substantially similar to a data memory array in the memory device;
- a reference charging circuit adapted to selectively charge a reference bitline in the reference memory array to a second voltage in a read operation; and
- a switching circuit adapted to selectively couple the data bitline precharged to the first voltage in the data memory array with the reference bitline in the reference memory array pre-charged to the second voltage in the read operation after the data bitline and the reference bitline have been precharged to provide a reference voltage on the coupled data and reference bitlines between the first and second voltages.

2. A reference generator for providing a reference voltage to a data bitline precharged to a first voltage in a folded bitline ferroelectric memory device, comprising:
- a ferroelectric reference memory array substantially similar to a data memory array in the memory device;
- a reference charging circuit adapted to selectively charge a reference bitline in the reference memory array to a second voltage in a read operation; and
- a switching circuit adapted to selectively couple a data bitline precharged to the first voltage in the data memory array with the reference bitline in the reference memory array ore-charged to the second voltage in the read operation to provide a reference voltage on the coupled data and reference bitlines between the first and second voltages;
- wherein the data bitline is coupled with a first integer number of ferroelectric data memory cells in the data memory array, wherein the reference bitline is coupled with a second integer number of ferroelectric reference memory cells in the reference memory array, and wherein the switching circuit is adapted to couple the data bitline and the reference bitline to provide the reference voltage approximately according to a ratio of the second integer number to the sum of first and second integer numbers and according to the difference between the second voltage and the first voltage.

3. The reference generator of claim 2, wherein the switching circuit is adapted to couple the data bitline and the reference bitline to provide the reference voltage approximately according to the first voltage plus the ratio of the second integer number to the sum of the first and second integer numbers times the difference between the second voltage and the first voltage.

4. A reference generator for providing a reference voltage to a data bitline precharged to a first voltage in a folded bitline ferroelectric memory device, comprising:
- a ferroelectric reference memory array substantially similar to a data memory array in the memory device;
- a reference charging circuit adapted to selectively charge a reference bitline in the reference memory array to a second voltage in a read operation; and
- a switching circuit adapted to selectively couple a data bitline precharged to the first voltage in the data memory array with the reference bitline in the reference memory array pre-charged to the second voltage in the read operation to provide a reference voltage on the coupled data and reference bitlines between the first and second voltages;
- wherein the reference memory array comprises a first set of ferroelectric reference memory cells coupled with a first reference bitline and a second set of ferroelectric reference memory cells coupled with a second reference bitline, wherein the reference charging circuit is adapted to selectively charge the second reference bitline to a second voltage in a read operation in which one of a first set of ferroelectric data memory cells along a first data bitline is being read and to selectively charge the first reference bitline to the second voltage in a read operation in which one of a second set of ferroelectric data memory cells along a second data bitline is being read, and wherein the switching circuit is adapted to selectively couple the second data bitline with the second reference bitline in a read operation in which one of the first set of ferroelectric data memory cells is being read and to couple the first data bitline with the first reference bitline in a read operation in which one of the second set of ferroelectric data memory cells is being read.

* * * * *